(12) United States Patent
Ceglio et al.

(10) Patent No.: US 9,585,236 B2
(45) Date of Patent: Feb. 28, 2017

(54) SN VAPOR EUV LLP SOURCE SYSTEM FOR EUV LITHOGRAPHY

(71) Applicant: Media Lario S.R.L., Bosisio Parini (IT)

(72) Inventors: Natale M. Ceglio, Pleasanton, CA (US); Daniel Stearns, Los Altos Hills, CA (US); Richard Levesque, Livermore, CA (US)

(73) Assignee: Media Lario SRL, Bosisio Parini (IT)

( * ) Notice: Subject to any disclaimer, the term of this patent is extended or adjusted under 35 U.S.C. 154(b) by 88 days.

(21) Appl. No.: 14/260,306

(22) Filed: Apr. 24, 2014

(65) Prior Publication Data

US 2014/0326904 A1    Nov. 6, 2014

Related U.S. Application Data

(60) Provisional application No. 61/819,435, filed on May 3, 2013.

(51) Int. Cl.
*H05G 2/00* (2006.01)
*G03F 7/20* (2006.01)

(52) U.S. Cl.
CPC ......... *H05G 2/005* (2013.01); *G03F 7/70033* (2013.01); *G03F 7/70916* (2013.01); *H05G 2/006* (2013.01); *H05G 2/008* (2013.01)

(58) Field of Classification Search
CPC .......... H05G 2/00; H05G 2/001; H05G 2/003; H05G 2/005; H05G 2/006; H05G 2/008
USPC ..................................................... 250/504 R
See application file for complete search history.

(56) References Cited

U.S. PATENT DOCUMENTS

| | | |
|---|---|---|
| 6,133,577 A | 10/2000 | Gutowski et al. |
| 6,469,310 B1 | 10/2002 | Fiedorowicz et al. |
| 6,507,641 B1 | 1/2003 | Kondo et al. |
| 6,711,233 B2 | 3/2004 | Hertz et al. |
| 6,924,600 B2 | 8/2005 | Mochizuki |
| 7,414,253 B2 | 8/2008 | Kleinschmidt et al. |
| 7,465,946 B2 | 12/2008 | Bowering et al. |

(Continued)

FOREIGN PATENT DOCUMENTS

| | | |
|---|---|---|
| JP | 2009 104924 | 5/2009 |
| JP | 2012-018820 | 1/2012 |

OTHER PUBLICATIONS

Milchberg et al., Clustered Gases as a Medium for Efficient Plasma Waveguide Generation, 2006, Philosophical Transactions of the Royal Society, 364, pp. 647-661.*

(Continued)

*Primary Examiner* — Jason McCormack
(74) *Attorney, Agent, or Firm* — Opticus IP Law PLLC

(57) ABSTRACT

A Sn vapor EUV LLP source system for EUV lithography is disclosed. The system generates a Sn vapor column from a supply of Sn liquid. The Sn column has a Sn-atom density of $<10^{19}$ atoms/cm$^3$ and travels at or near sonic speeds. The system also has a Sn vapor condenser arranged to receive the Sn vapor column and condense the Sn vapor to form recycled Sn liquid. A pulse laser irradiates a section of the Sn vapor column. Each pulse generates an under-dense Sn plasma having an electron density of $<10^{19}$ electrons/cm$^3$, thereby allowing the under-dense Sn plasma substantially isotropically emit EUV radiation.

19 Claims, 11 Drawing Sheets

(56) References Cited

U.S. PATENT DOCUMENTS

| | | |
|---|---|---|
| 7,476,886 B2 | 1/2009 | Bykanov et al. |
| 8,198,615 B2 | 6/2012 | Bykanov et al. |
| 8,686,381 B2 | 4/2014 | Levesque et al. |
| 2002/0014599 A1 | 2/2002 | Birx et al. |
| 2003/0095623 A1 | 5/2003 | Singer et al. |
| 2004/0183030 A1 | 9/2004 | Roux |
| 2006/0215712 A1 | 9/2006 | Ziener et al. |
| 2007/0023709 A1 | 2/2007 | Kanazawa et al. |
| 2007/0045573 A1 | 3/2007 | Kleinschmidt et al. |
| 2007/0228298 A1 | 10/2007 | Komori et al. |
| 2008/0087840 A1* | 4/2008 | Ueno et al. ............ 250/396 ML |
| 2008/0099699 A1* | 5/2008 | Yabuta et al. ............ 250/504 R |
| 2008/0272317 A1* | 11/2008 | Shumlak et al. ......... 250/504 R |
| 2008/0283779 A1 | 11/2008 | Tran et al. |
| 2009/0224182 A1* | 9/2009 | McGeoch ............ H05G 2/005 |
| | | 250/504 R |
| 2010/0264336 A1 | 10/2010 | Neff |
| 2010/0303199 A1 | 12/2010 | Wallhead et al. |
| 2011/0101863 A1* | 5/2011 | Komori et al. .......... 315/111.41 |
| 2011/0242515 A1* | 10/2011 | Ceglio et al. .................... 355/67 |
| 2011/0284774 A1 | 11/2011 | Ishihara et al. |
| 2012/0097869 A1* | 4/2012 | Ueno ..................... H05G 2/008 |
| | | 250/504 R |
| 2012/0145930 A1* | 6/2012 | Kuwabara .............. H05G 2/008 |
| | | 250/504 R |
| 2012/0280149 A1 | 11/2012 | Mestrom et al. |
| 2013/0126762 A1 | 5/2013 | Moriya et al. |
| 2013/0146682 A1 | 6/2013 | Ishihara et al. |
| 2013/0207004 A1* | 8/2013 | Ceglio et al. ............ 250/504 R |

OTHER PUBLICATIONS

Search Report and Written Opinion dated Dec. 23, 2015, for Netherlands Patent Application No. 2012709, which is a counterpart to the above-identified US Patent Application.

* cited by examiner

SN VAPOR EUV LLP SOURCE SYSTEM FOR EUV LITHOGRAPHY

CLAIM OF PRIORITY

The present application claims priority under 35 USC §119(e) from U.S. Provisional Patent Application Ser. No. 61/819,435, filed on May 3, 2013, and which is incorporated by reference herein.

The entire disclosure of any publication or patent document mentioned herein is incorporated by reference, including U.S. patent application Ser. No. 13/065,008, entitled "EUV collector system with enhanced EUV radiation collection," filed on Mar. 11, 2011, and which has issued as U.S. Pat. No. 8,587,768; U.S. patent application Ser. No. 12/803,461, entitled "Source-collector module with GIC mirror and Sn vapor LPP target system, filed on Jun. 28, 2010, and which has issued as U.S. Pat. No. 8,686,381; U.S. patent application Ser. No. 13/761,189, entitled "Source collector modules for EUV lithography employing a GIC mirror and an LPP source," filed on Feb. 7, 2013; and U.S. Pat. No. 8,411,815, entitled "Grazing incidence collector for laser produced plasma source," issued on Apr. 2, 2013.

FIELD

The present disclosure relates to extreme ultraviolet (EUV) sources, and in particular relates to a Sn vapor EUV laser-produced plasma (LPP) source system for use in EUV lithography.

BACKGROUND

Current EUV lithography technology suffers from inadequate source power. For commercially viable EUV lithography, 1 kW (1000 W) of EUV power at the intermediate focus (IF) is required. Unfortunately, to date only about 50 W has been achieved.

Current EUV source systems use a pulsed IR laser driver in conjunction with a Sn droplet target and a multilayer coated normal incidence collector (NIC). Unfortunately, scaling this source system to high EUV power (e.g., 1 kW at the IF) is prohibitively difficult. In particular, to obtain 1 kW EUV power at the IF requires a drive laser power in excess of 100 kW at the Sn target, along with pulsed laser synchronized to hit the Sn droplet targets (operating at about 100 kHz), which is extremely demanding. Furthermore, the laser-target interaction physics in the current scheme produces high levels of reflected IR laser power from the LPP, resulting in reduced conversion efficiency from laser power to EUV power. This also poses the risk of damage to downstream optical components and the wafers. At high power, the debris from the LPP puts the NIC at serious risk of being damaged very quickly. All these problems scale at least linearly with the increase of EUV power at the IF.

SUMMARY

An aspect of the disclosure is a Sn vapor EUV LLP source system for EUV lithography. The system has a Sn vapor generator adapted to generate a Sn vapor column or jet from a supply of Sn liquid. The Sn column has a density of $<10^{19}$ atoms/cm$^3$. The system also has a Sn vapor condenser arranged to receive the Sn vapor column and condense the Sn vapor to form recycled Sn liquid. A Sn liquid collection system collects and delivers the recycled Sn liquid to the supply of Sn liquid. At least one pulsed laser is arranged to irradiate the Sn vapor column with laser pulse to generate an under-dense Sn plasma having an electron density of $<10^{19}$ electrons/cm$^3$, wherein the under-dense Sn plasma substantially isotropically emits EUV radiation. A train or series of the laser pulses is used to generate a time-series of Sn plasmas, e.g., at a rate from between 50 kHz and 150 kHz. In the case where multiple laser beams are used, the arrival time of the laser pulses of the different beams at the section of the Sn vapor column to be irradiated is synchronized.

An aspect of the disclosure is a Sn vapor EUV LLP source system for EUV lithography that includes: a Sn vapor chamber adapted to generate a Sn vapor column from a supply of Sn liquid, the Sn column having a Sn-atom density of $<10^{19}$ atoms/cm$^3$; a Sn vapor condenser arranged to receive the Sn vapor column and condense the Sn vapor to form recycled Sn liquid; a Sn liquid collection system that collects and delivers the recycled Sn liquid to the supply of Sn liquid; and at least one laser arranged to irradiate the Sn vapor column with at least one laser beam to generate an under-dense Sn plasma having an electron density of $<10^{19}$ electrons/cm$^3$, wherein the under-dense Sn plasma substantially isotropically emits EUV radiation.

Another aspect of the disclosure is the Sn vapor EUV LLP source system as described above, and further comprising a grazing-incidence collector (GIC) mirror arranged to receive and direct a first portion of the emitted EUV radiation to an intermediate focus.

Another aspect of the disclosure is the Sn vapor EUV LLP source system as described above, and further comprising a spherical normal-incidence collector (NIC) mirror arranged to receive and direct a second portion of the EUV radiation back through the under-dense plasma and to the GIC collector, which is configured to refocus the EUV to the intermediate focus.

Another aspect of the disclosure is the Sn vapor EUV LLP source system as described above, and further comprising: a first debris mitigation device (DMD) operably disposed between the Sn vapor column and the NIC mirror; and a second DMD operably disposed between the Sn vapor column and the GIC collector.

Another aspect of the disclosure is the Sn vapor EUV LLP source system as described above, and further comprising a containment vessel having an interior, and wherein the first and second DMDs are arranged at opposite sides of the containment vessel and are sealed thereto, and wherein the Sn vapor column travels from the Sn vapor generator to the Sn vapor condenser within the containment vessel interior.

Another aspect of the disclosure is the Sn vapor EUV LLP source system as described above, and further comprising at least one laser-beam conduit that leads into the containment vessel interior and through which the at least one laser beam travels.

Another aspect of the disclosure is the Sn vapor EUV LLP source system as described above, and further including a window system that includes a window and that is operably arranged relative to the least one laser-beam conduit so that the at least one laser beam travels through the window.

Another aspect of the disclosure is the Sn vapor EUV LLP source system as described, wherein the window system includes an isolation valve that seals off the laser-beam conduit from the containment vessel interior.

Another aspect of the disclosure is the Sn vapor EUV LLP source system as described above, and further comprising a radiation-enhancement collection device (RCED) arranged between the GIC mirror and the intermediate focus to further direct a portion of the EUV radiation from the GIC mirror to the intermediate focus.

Another aspect of the disclosure is the Sn vapor EUV LLP source system as described above, wherein the RCED includes a rear section configured to direct at least a portion of the EUV radiation to a downstream illuminator.

Another aspect of the disclosure is the Sn vapor EUV LLP source system as described above, wherein the EUV radiation at the intermediate focus has a power of at least 100 W.

Another aspect of the disclosure is the Sn vapor EUV LLP source system as described above, wherein the EUV radiation at the intermediate focus has a power of at least 500 W.

Another aspect of the disclosure is the Sn vapor EUV LLP source system as described above, wherein the EUV radiation at the intermediate focus has a power of at least 1000 W.

Another aspect of the disclosure is the Sn vapor EUV LLP source system as described above, and wherein the Sn vapor column has a nominal diameter of 2 mm.

Another aspect of the disclosure is the Sn vapor EUV LLP source system as described above, wherein the Sn vapor generator comprises: a chamber having an interior that contains the Sn liquid and Sn vapor, the chamber having a sonic nozzle; and a heat source arranged to heat the Sn liquid that resides in the chamber interior to form the Sn vapor and cause the Sn vapor to escape the sonic nozzle at a sonic speed to form the Sn vapor column.

Another aspect of the disclosure is the Sn vapor EUV LLP source system as described above, wherein the sonic nozzle has an input end having a first diameter of about 20 mm, an output end having a diameter of about 2 mm, and a length from the input to output ends of about 40 mm.

Another aspect of the disclosure is the Sn vapor EUV LLP source system as described above, wherein the at least one laser consists of two or more lasers that each generate a laser beam that is made incident symmetrically upon the Sn vapor column from two or more directions.

Another aspect of the disclosure is the Sn vapor EUV LLP source system as described above, wherein the Sn vapor column has a nominal diameter of between 1 mm to 3 mm.

Another aspect of the disclosure is the Sn vapor EUV LLP source system as described above, and further comprising a plurality of laser beams that each include laser pulses, and wherein laser pulses are made incident upon the Sn vapor column simultaneously to form the under-dense Sn plasma.

Another aspect of the disclosure is a method of generating EUV radiation, comprising: forming a Sn vapor column having a Sn atom density of $<10^{19}$ atoms/cm$^3$, wherein the Sn vapor in the Sn vapor column travels at or near a sonic speed; and irradiating a section of the Sn vapor column with a pulsed laser beam from one or more directions to form an under-dense Sn plasma having $<10^{19}$ electrons/cm$^3$ and that substantially isotropically emits the EUV radiation.

Another aspect of the disclosure is the method as described above, and further comprising: converting liquid Sn in a Sn reservoir to Sn vapor; and passing the Sn vapor through a sonic nozzle to form the Sn vapor column.

Another aspect of the disclosure is the method as described above, wherein the sonic nozzle has an input end opening having a first diameter in the range from 15 mm to 25 mm, an output end orifice having a diameter in the range from 1 mm to 3 mm, and an overall length from the input end to the output end of about 35 to 45 mm.

Another aspect of the disclosure is the method as described above, and further comprising condensing Sn vapor from the Sn vapor column and returning the condensed Sn vapor to the Sn reservoir.

Another aspect of the disclosure is the method as described above, and further comprising receiving and directing a first portion of the EUV radiation to an intermediate focus using a grazing-incidence collector (GIC) mirror.

Another aspect of the disclosure is the method as described above, and further comprising employing a radiation-enhancement collection device (RCED) arranged between the GIC mirror and the intermediate focus to further direct EUV radiation from the GIC mirror to the intermediate focus.

Another aspect of the disclosure is the method as described above, wherein the RCED includes a rear section configured to optimally direct at least a portion of the EUV radiation to a downstream illuminator.

Another aspect of the disclosure is the method as described above, and further comprising: using a normal-incidence collector (NIC) mirror, collecting and directing a second portion of the EUV radiation back to and through the under-dense Sn plasma to the GIC mirror; and using the GIC mirror, refocusing the second portion of the EUV radiation to the intermediate focus.

Another aspect of the disclosure is the method as described above, and wherein the RCED includes a rear section configured to optimally direct at least a portion of the EUV radiation to a downstream illuminator.

Another aspect of the disclosure is the method as described above, and further comprising: employing a first debris mitigation device (DMD) between the Sn vapor column and the NIC mirror to reduce or prevent debris from the Sn plasma from depositing on the NIC mirror; and employing a second DMD between the Sn vapor column and the GIC collector to reduce or prevent debris from the Sn plasma from depositing on the GIC mirror.

Another aspect of the disclosure is the method as described above, wherein the EUV radiation at the intermediate focus has a power of at least 500 Watts.

Another aspect of the disclosure is the method as described above, wherein the EUV radiation at the intermediate focus has a power of at least 1000 Watts.

Another aspect of the disclosure is the method as described above, and wherein the pulsed laser beam originates from two or more lasers that each generate a laser beam, and wherein the two or more beams are made incident upon the Sn vapor column from two or more directions.

Another aspect of the disclosure is the method as described above, wherein the Sn vapor column travels within an interior of at least one containment vessel.

Another aspect of the disclosure is the method as described above, and wherein the at least one pulsed laser beam travels through a laser-beam conduit to the interior of the at least one containment vessel.

Another aspect of the disclosure is the method as described above, wherein the at least one pulsed laser beam travels through a window of a window system operably arranged relative to the laser-beam conduit, wherein the window system is configured to seal the laser-beam conduit from the interior of the at least one containment vessel.

Additional features and advantages will be set forth in the Detailed Description which follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, which are described below and in the Appendices.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Figure 1:
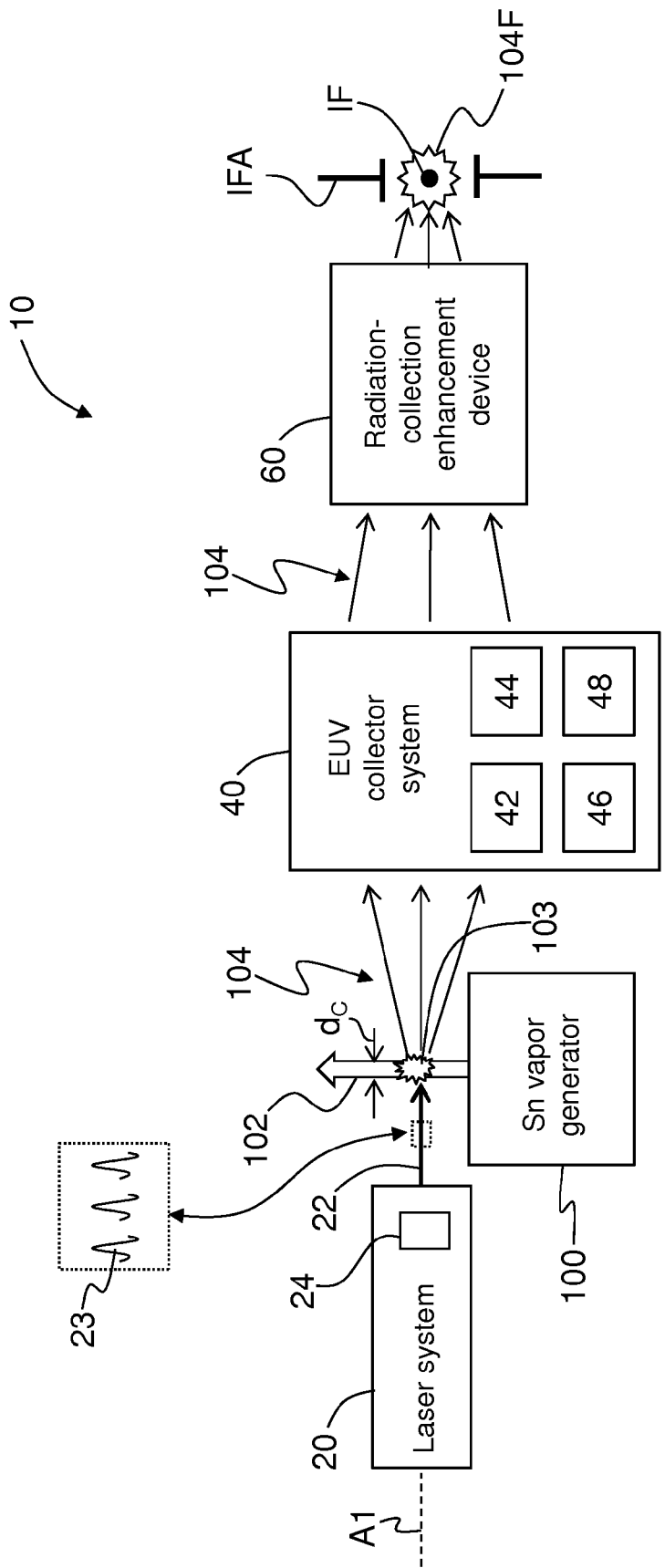
FIG. 1 is a schematic diagram of an example Sn vapor EUV LLP source system according to the disclosure.

FIG. 1 is a schematic diagram of an example Sn vapor EUV LLP source system ("system") 10 according to the disclosure. System 10 has an axis A1 and includes the following main components: a laser system 20, Sn vapor generator 100, an EUV collector system 40, an optional radiation-enhancement collection device (RCED) 60, and an intermediate-focus aperture IFA located substantially at an intermediate focus IF of the EUV collector system 40.

Laser system 20 is configured to generate at least one laser beam 22 that is defined by a train of laser pulses 23 (see close-up inset). An example laser system 20 includes at least one $CO_2$ laser that emits laser beam(s) 22 at a wavelength of nominally 10.6 μm. The Sn vapor generator 100 is configured to generate a Sn vapor column 102 of width (diameter) $d_C$. In the general operation of system 10, the pulses 23 of the at least one laser beam 22 are made incident upon Sn vapor column 102. The pulses 23 from the one or more laser beams 22 that arrive at the Sn vapor column 102 at the same time form a plasma 103 (i.e., an LPP) that substantially isotropic emission of EUV radiation 104. The series of pulses 23 in the one or more laser beams 22 thus generate a time-series of plasmas 103 at the same location in Sn vapor column 102, as explained in greater detail below. For ease of understanding, the discussion sometimes focuses on the formation of a single plasma 103, unless otherwise noted.

A portion of EUV radiation 104 emitted by plasma 103 is collected by the EUV collector system 40 and is directed to the intermediate focus IF at or near the intermediate-focus aperture IFA. The RCED 60 serves to more efficiently (and in an example, optimally) direct the collected EUV radiation 104 to the intermediate focus to form focused EUV radiation 104F. In an example, EUV radiation 104 has a nominal wavelength of 13.5 nm.

Though not apparent from the schematic representation of system 10 of FIG. 1, EUV collector system 40 can include a normal-incidence collector (NIC) mirror 42 and a grazing-incidence collector (GIC) mirror 44 located on opposite sides of Sn vapor column 102. EUV collector system 40 can also include one or more debris mitigation devices (DMDs) 48 and a buffer gas 46 as discussed in greater detail below. Laser system 22 can also include laser optics 24 for conditioning laser beam 22 (e.g., focusing, collimating, shaping, spatial filtering, redirecting, etc.).

Figure 2:
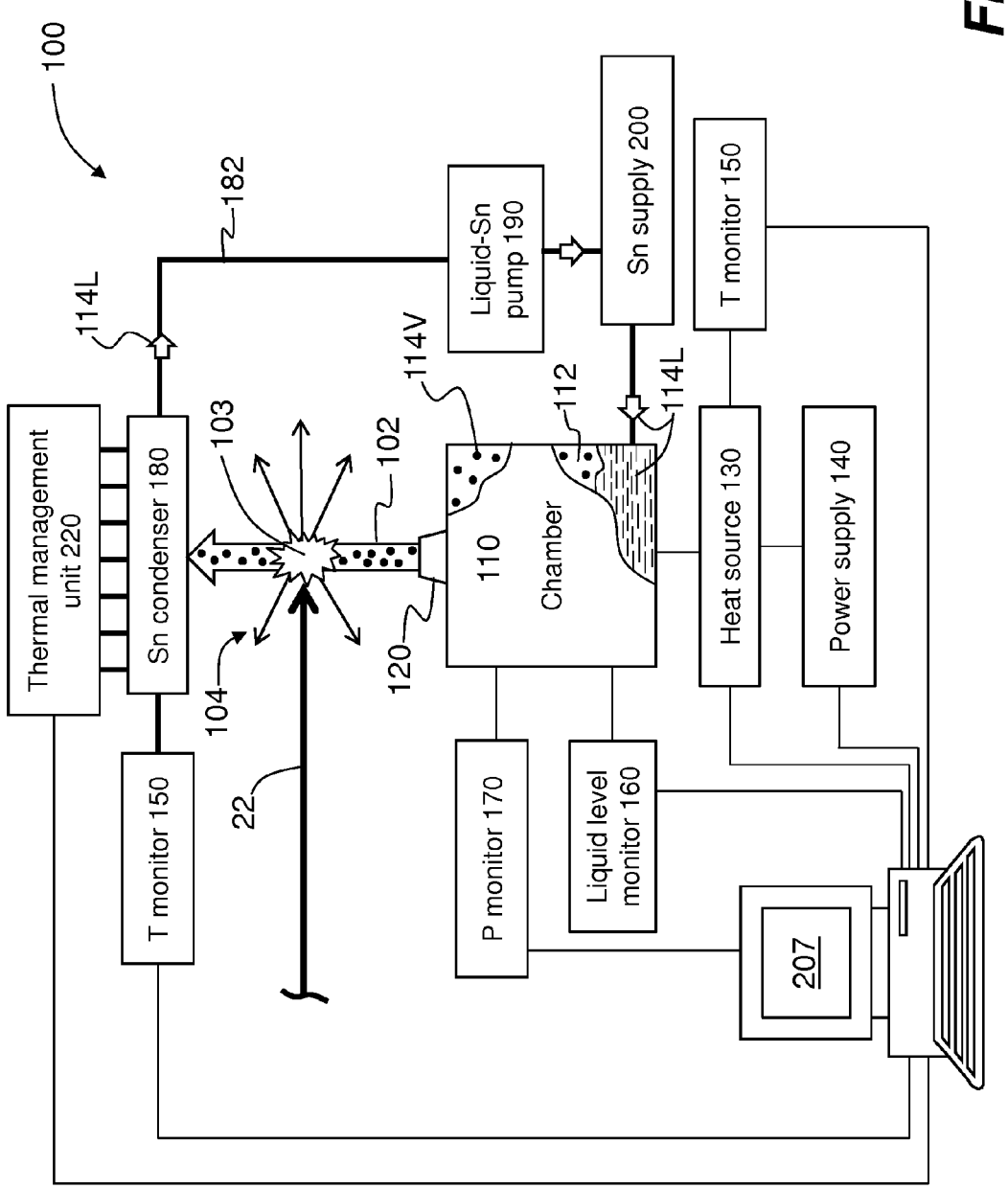
FIG. 2 is a schematic diagram of an example Sn vapor generator used in the Sn vapor EUV LLP source system of FIG. 1.

FIG. 2 is a more detailed schematic diagram of the Sn vapor generator 100. Sn vapor generator 100 includes a Sn vapor chamber ("chamber") 110 that has an interior 112 that contains Sn liquid 114L as well as Sn vapor 114V. Since Sn is immiscible with Mo and with W, and both have melting temperatures above the 2875 K vaporization temperature of Sn, both Mo and W are good candidate materials for forming chamber 110. Other materials that can be used include Ta, Re, and graphite.

Chamber 110 includes a sonic nozzle 120 through which Sn vapor exits a sonic or near-sonic speed to form Sn vapor column 102. Sn vapor generator 100 also includes a heat source 130 operably arranged relative to chamber 110. A power supply 140 is electrically connected to heat source 130 to drive the heat source. A temperature (T) monitor 150 is operably arranged relative to the heat source 130 to monitor the temperature of the heat source. A liquid-level monitor 160 is operably arranged relative to chamber 110 to monitor the level of Sn liquid 114L within the chamber. A pressure (P) monitor 170 is operably arranged relative chamber 110 to monitor the pressure of Sn vapor 114V within the chamber.

Sn vapor generator 110 also includes a Sn condenser 180 is arranged to intercept the Sn vapor column 102. Sn condenser 180 is fluidly connected to a liquid-Sn pump 190, which in turn is fluidly connected to a Sn supply 200, which in turn is fluidly connected to the interior 112 of changer 110. In an example, Sn vapor generator 110 includes a controller 207 that is operably connected to heat source 130, liquid-level monitor 160, T monitor 150, P monitor 170 and Sn supply 200 (introduced and discussed below) to control the overall operation of the Sn vapor generator.

Controller 207 can be any type of controller (e.g., a computer, computer-controller, etc.) used to control the operation of devices as part of a larger system. In an example, controller 207 executes instructions stored in firmware or software that cause system 10 to control the operation of system 10 and carry out the methods described herein. In an example, controller 207 is programmed to perform functions described herein. The "controller" is not limited to just those integrated circuits referred to in the art as controllers, but broadly refers to computers, processors, microcontrollers, microcomputers, programmable logic controllers, application specific integrated circuits, and other programmable circuits.

In the general operation of Sn vapor generator, heat source 130 generates heat that heats Sn liquid 114L in chamber interior 112. The heat causes the Sn liquid 114L to boil, thereby forming Sn vapor 114V. The Sn vapor 114V thus formed is under pressure within chamber interior 112. The internal pressure within chamber interior 112 causes the Sn vapor 114V to escape the chamber interior through sonic nozzle 120 at high speeds, i.e., at or near sonic speeds (i.e., at or near the speed of sound), thereby forming Sn vapor column 102. The laser beam 22 is made incident upon a portion of Sn vapor column 102, thereby creating a laser-produced plasma ("plasma") 103 that emits EUV radiation 104, as explained in greater detail below.

The Sn vapor 114V in Sn vapor column 102 that is not consumed by the formation of plasma 102 is incident upon Sn condenser 180, which is configured to condense the Sn vapor to form Sn liquid 114L. The Sn liquid 114L so formed is collected and conducted (e.g., via conduit 182) to liquid-Sn pump 190, which pumps the liquid Sn to Sn supply 200. The Sn supply 200 is used to maintain the necessary supply of liquid SN 114L to chamber interior 112. Liquid-level monitor 160 monitors the amount of Sn liquid 114L in chamber interior 112 and provides this information to controller 207. If more Sn liquid 114L is required, controller 207 can cause Sn supply 200 to add more Sn to chamber interior 112. Thus, Sn vapor generator 100 recycles unspent Sn by having a recirculation configuration, and can also add new Sn to the system via Sn supply 200.

Sn vapor generator 100 also optionally includes a thermal management unit 220 operably arranged relative to Sn condenser 180, along with additional T monitor 150 arranged to monitor the temperature of the Sn condenser. The thermal management unit 220 and additional T monitor 150 can be operably connected to controller 207. Thermal management unit 220 serves to control the temperature of Sn condenser 180 by either heating it or cooling it. This configuration allows for temperature control of the Sn condenser 180 to ensure it operates at an appropriate temperature, i.e., not too hot so that it cannot condense the Sn vapor, but not so cool that it would inhibit the flow of Sn liquid. It also increases the amount of information supplied to controller 207 so that the controller can employ improved feedback control for the operation of Sn vapor generator 100.

Example Sn Vapor Generator

Figure 3:
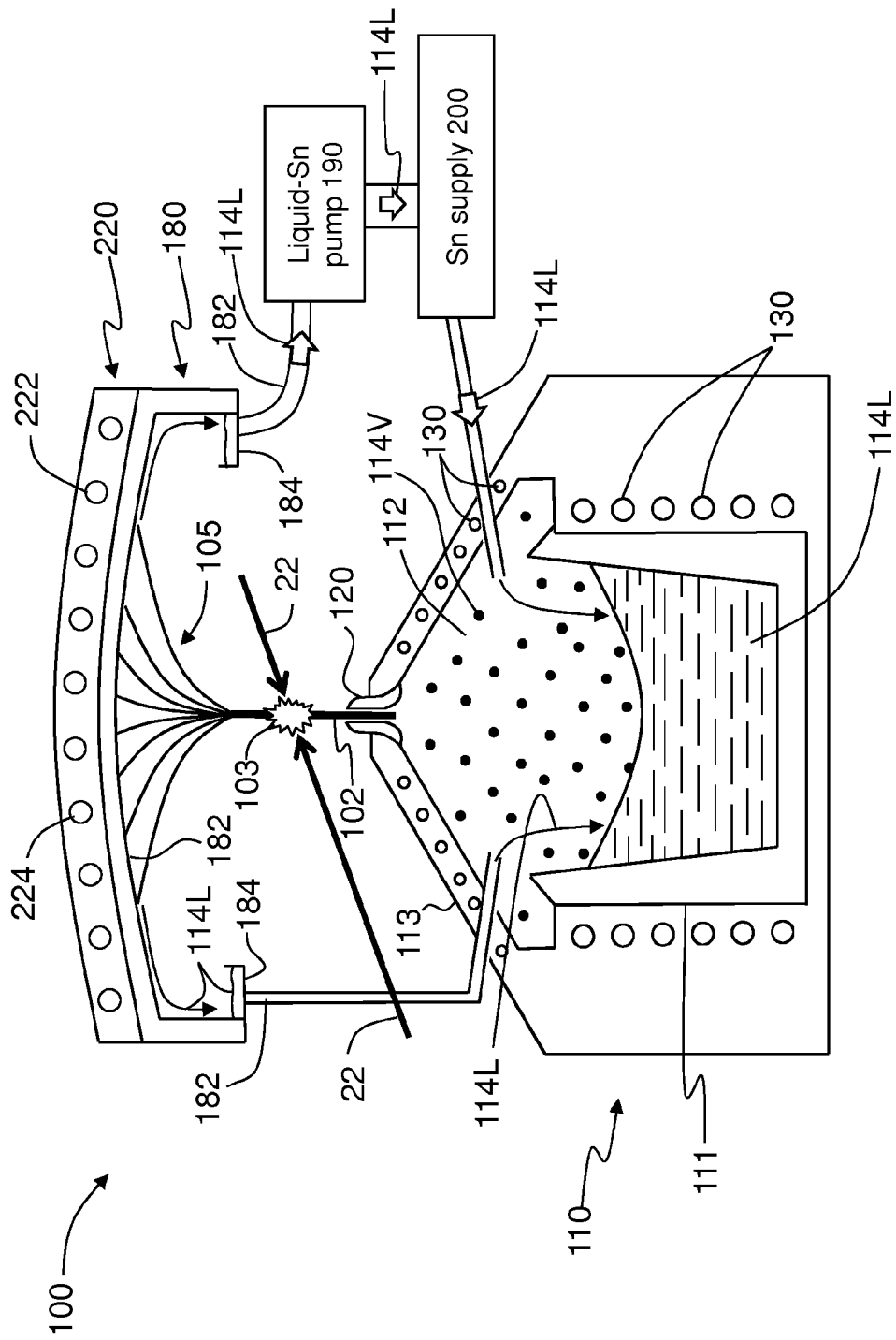
FIG. 3 is a more detailed schematic diagram of an example Sn vapor generator.

FIG. 3 is a cross-sectional diagram of an example Sn vapor generator 100. The example Sn vapor generator 100 shows chamber 110 as including a crucible 111 that in part defines the aforementioned chamber interior 112. Chamber 110 also includes a dome-like roof 113 with a peak or high point at which is located sonic nozzle 120. Heat source 130 is shown by way of example in the form of heating coils that surround crucible 111 and that are also located either within or adjacent roof 113 to provide additional heating (e.g., to heat the Sn vapor 114V so that it does not condense on the roof or in the sonic nozzle).

The example Sn condenser 180 is shown as having a curved inner surface 182 on which Sn vapor 114V condenses. The curved shape allows for the condensed Sn liquid 114V to adhere to the surface (via surface tension of the Sn liquid) and to flow along the surface (e.g., by gravity) down to an inner ledge 184, which configured to catch the Sn liquid. Ledge 184 is fluidly connected to conduit 182, which in turn is fluidly connected to liquid-Sn pump 190, which in turn is fluidly connected to Sn supply 200. In an example, ledge 184 can also be directly fluidly connected to chamber interior 112 via another conduit 182. As explained in greater detail below, the pressure of Sn vapor 114V in chamber interior 112 is such that the Sn vapor column 102 that exits sonic nozzle 120 to form Sn vapor column 102 has a density of $<10^{19}$ atoms/cm$^3$. The Sn vapor column 102 is shown as ultimately forming a plume 105 that is captured by curved surface 182 of Sn condenser 180. Thermal management unit 220 is also shown by way of example as including fluid lines 222 through which cooling or heating fluid can flow to control the temperature of Sn condenser 180. Other forms of thermal management unit 220 known in the art can also be employed.

FIG. 3 also shows two laser beams 22 made incident upon a section of Sn vapor column 102 from two different directions to create the EUV-emitting plasma 103. In an example, the two laser beams are incident from opposite directions, i.e., along an axis perpendicular to the plane of the drawing.

Figure 4:
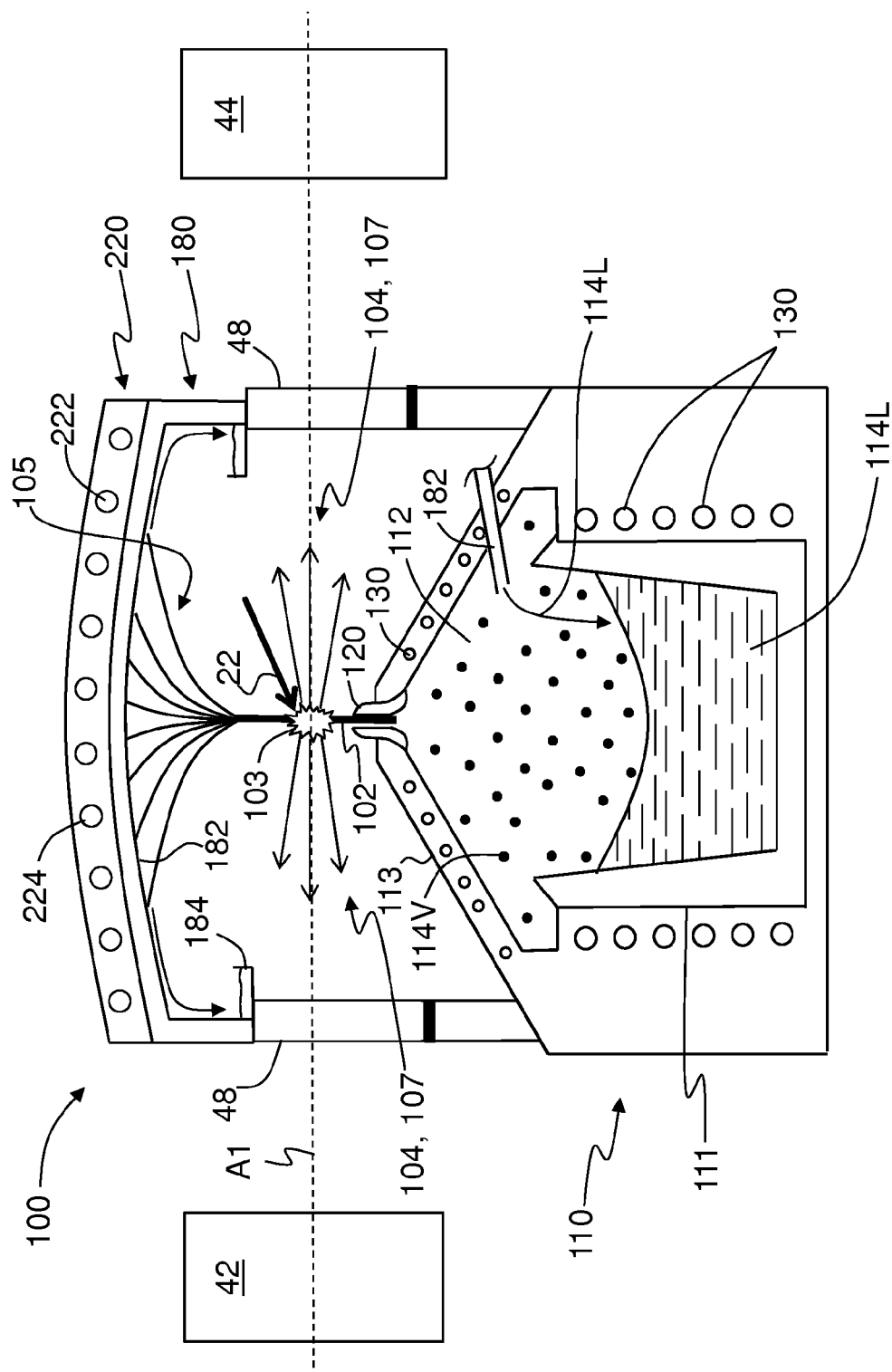
FIG. 4 is similar to FIG. 3 and shows an example embodiment of the Sn vapor generator that includes debris mitigation devices (DMDs) located on either side of the Sn vapor column, and also showing an example arrangement of a NIC mirror and a GIC mirror as part of the EUV collector system of FIG. 1.

FIG. 4 is similar to FIG. 3 but shows the two debris mitigating devices (DMDs) 48 arranged on opposite sides of Sn vapor column 102. A single laser beam 22 that travels in a direction perpendicular to the page is also shown by way of example. Also, some of the components of Sn vapor generator 100 are omitted for ease of illustration. Also shown in FIG. 4 are NIC mirror 42 and GIC mirror 44 located along axis A1 on opposite sides of Sn vapor generator 110 and thus adjacent respective DMDs 48.

Each pulse 23 in laser beam 22 interacts with a portion of Sn vapor column 102 to form plasma 103. Besides emitting EUV radiation 104, plasma 103 also generates debris 107, which includes charged and uncharged Sn particles (e.g., atoms and ions) that travel towards NIC mirror 42 and GIC mirror 44 with a variety of different speeds (energies). The two DMDs 48 are configured to substantially reduce the flux of debris 107 that reaches NIC mirror 42 and GIC mirror 44.

In an example embodiment, the DMDs 48 each include rapidly spinning blades or vanes (see FIG. 7) that intercept the debris 107 as the debris flows away from plasma 103 and towards NIC mirror 42 and GIC mirror 44. In an example, buffer gas 46 can be used to slow down at least some of the debris 107 to increase the probability of debris capture at the DMDs 48. The rotation speed of the DMD blades can be very high (e.g., many thousands of RPM) so that they can capture high-speed debris particles while still appearing to be stationary when compared to the speed of light of EUV radiation 104.

In an example, DMDs 48 includes rear stationary vanes 49 that can be are axially longer than the rotating vanes and that act as debris catchers.

Figure 5:
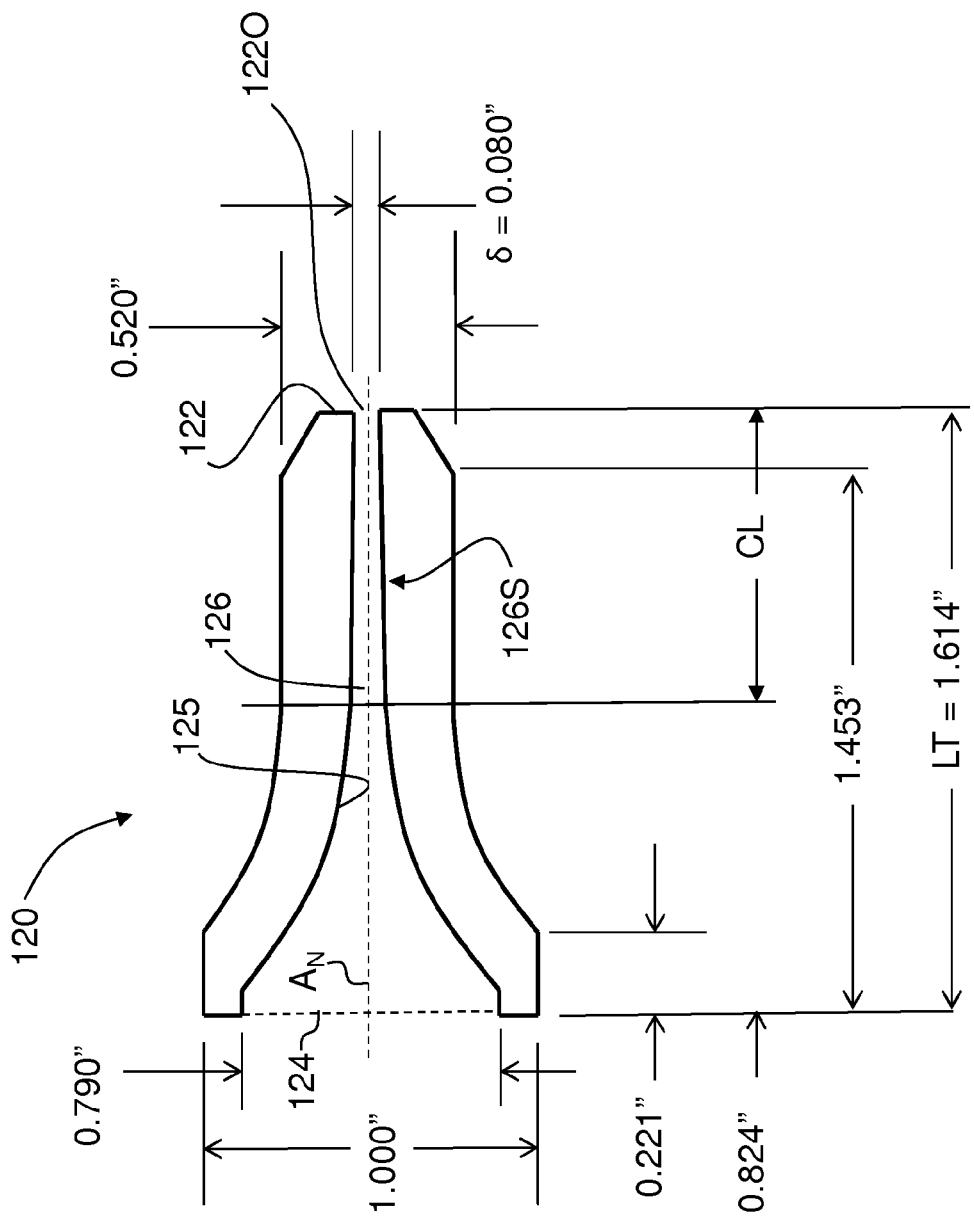
FIG. 5 is a cross-sectional view of an example sonic nozzle used to generate the Sn vapor column.

FIG. 5 is a close-up cross-sectional view of an example sonic nozzle 120. In an example, sonic nozzle 120 is rotationally symmetric about a long sonic-nozzle axis $A_N$. Exemplary dimensions are included for the sake of non-limiting illustration, and a range for each of the dimensions is possible, as will be appreciated by one skilled in the art. For example, the input end can have on open diameter in the range from 15 mm to 25 mm, the output end orifice 122O can have a diameter δ in the range from 1 mm to 3 mm, and the overall (total) length LT of the sonic nozzle from the input end to the output end can be in the range from about 35 to 45 mm.

Sonic nozzle 120 has a front or output end 122 with an orifice 122O, and a back or input end 124. Sonic nozzle 120 includes an inner wall 125 that defines in the present example embodiment a trumpet-shaped channel 126 that is wider at input end 124 and is narrower at output end 122. The size of channel 126 at output end 122 defines the size of Sn vapor column 122. Channel 126 is shown by way of example as having a diameter δ at output end 122 of δ=0.080", which is nominally 2 mm. This configuration for sonic nozzle 120 thus defines a diameter $d_C$=2 mm (see FIG. 1) for Sn vapor column 102. In an example, the input end 122 defines an opening of having a diameter of about 20 mm (0.79"). In an example, channel 126 includes a section 126S adjacent output end 122 that has a substantially constant length CL. The advantage of having such a section is discussed in greater detail below.

Dual-Sided System

Figure 6:
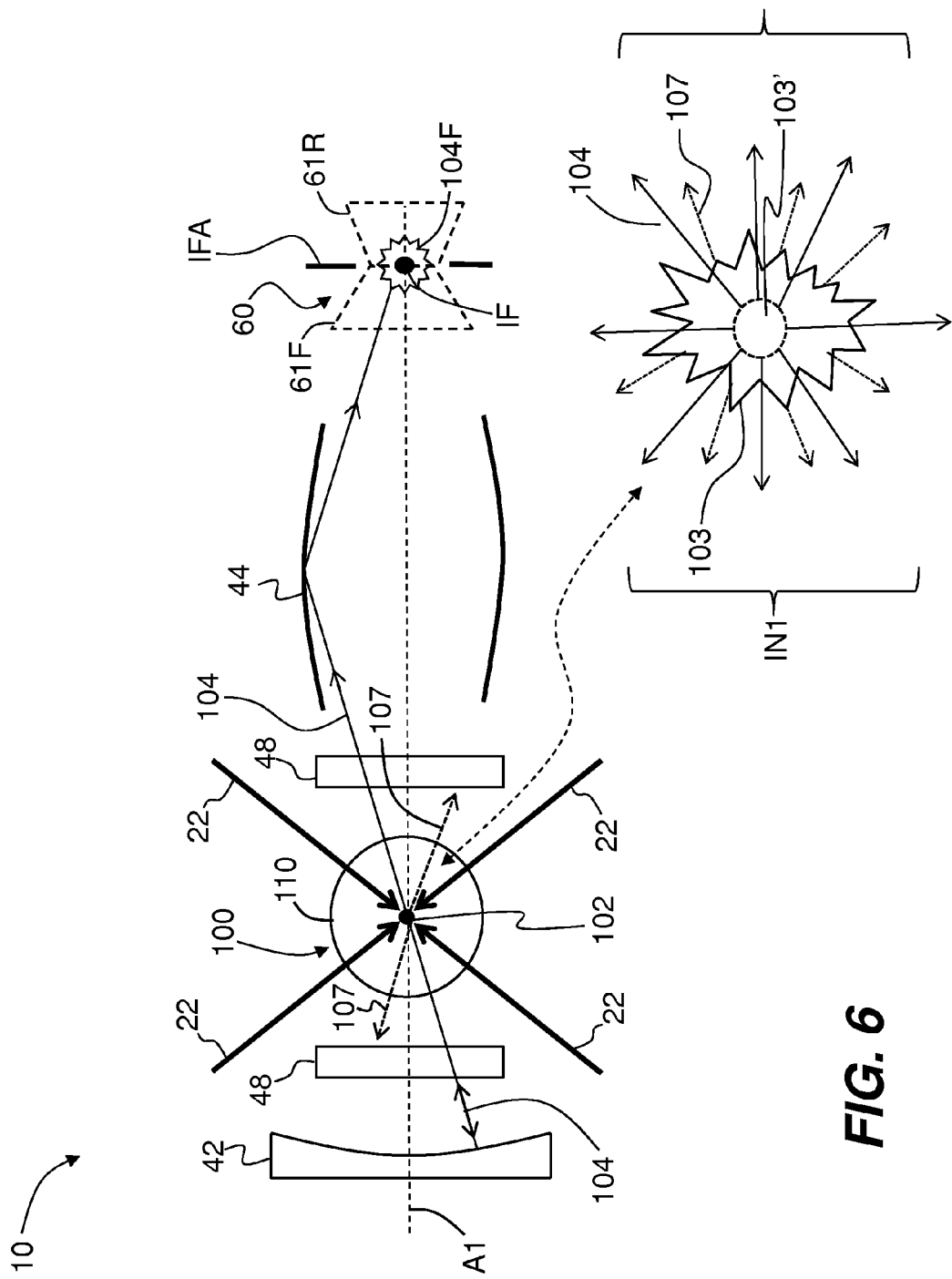
FIG. 6 is a schematic diagram of example dual-sided Sn vapor EUV LLP source system.

FIG. 6 is a top-down view of another example embodiment of system 10 that utilizes the Sn vapor generator 100 disclosed herein. It is noted here that system 10 is also called a source-collector module or "SoCoMo". In FIG. 6, the Sn condenser 180 is not shown so that the Sn vapor column 102 is visible.

System 10 uses NIC mirror 42 and GIC mirror 44 on opposite sides of the Sn vapor generator 100 so that system 10 is a "dual-sided" system. Four laser beams 22 are shown as being incident from different directions upon a common position at Sn vapor column 102. As few as one laser beam 22 and more than four laser beams can also be used in other embodiments. DMDs 48 reside between the Sn vapor column 102 and the NIC and GIC mirrors, respectively. Debris 107 is shown being incident upon and captured by each DMD 48.

The close-up inset IN1 in FIG. 6 more clearly shows EUV-emitting plasma 103 formed by each laser pulse 23, along with attendant EUV radiation 104 and debris 107. Note that the emission of the EUV radiation 104 is substantially isotropic, as is the emission of debris 107. The laser beams 22 are omitted from the close-up inset IN1 for ease of illustration.

The close-up inset IN1 also shows a central region 103' of plasma 103 that generates most of EUV radiation 104. Thus, central region 103' can be considered to represent the true size of the LPP EUV radiation source. In an example, the central region 103' can be 500 μm or even smaller. This is about 25% of the example 2 mm diameter $d_C$ of the Sn vapor column 102.

A portion of EUV radiation 104 from plasma 103 travels through the leftmost DMD 48 to NIC mirror, which in an example is spherical and reflects the EUV radiation back through the location of plasma 103. This reflected EUV radiation 104 then travels through the rightmost DMD 48 and to GIC mirror 44. Another portion of the EUV radiation 104 travels directly through the rightmost DMD 48 and then to GIC mirror 44. The dual-sided NIC-GIC configuration of system 10 thus serves to collect a substantial portion of the total emitted EUV radiation 104. Example collection efficiencies of this dual-sided configuration of system 10 are discussed below. The ability to capture a substantial amount of the emitted EUV radiation is one advantage of having plasma 103 that emits EUV radiation substantially isotropically.

The EUV radiation 104 that passes through the rightmost DMD is grazingly reflected by GIC mirror 44 and is directed to intermediate focus IF, which resides substantially at the intermediate focus aperture IFA. Since the focusing by GIC mirror 44 is typically not perfect, the optional RCED 60 can be used to increase the concentration (i.e., reduce the spot size) of focused EUV radiation 104F at intermediate focus IF. In an example, RCED 60 includes front and rear sections 61F and 61R, wherein the rear section serves to control the direction of the funneled EUV radiation 104 toward the appropriate direction for use by the downstream illuminator (not shown).

System Parameters and Design Considerations

There are a number of key parameters and design considerations for system 10 as well as for Sn vapor generator 100.

1. Under-Dense Plasma

Plasma 103 is formed as an under-dense plasma, i.e., it has an electron density of less than $1 \times 10^{19}$ electrons/cm$^3$, and further in an example has an electron density in the range from $7 \times 10^{17}$ electrons/cm$^3$ to $1 \times 10^{19}$ electrons/cm$^3$. This is accomplished in part by ensuring that Sn vapor column has a Sn-atom density of less than $1 \times 10^{19}$ atoms/cm$^3$, or in another example has a Sn-atom density in the range from $7 \times 10^{17}$ atoms/cm$^3$ to $1 \times 10^{19}$ atoms/cm$^3$.

The under-dense plasma 103 has an electron density below the critical density at which infrared laser beam(s) 22 (e.g., at 10.6 μm) will substantially reflect from the plasma. This density is about $5 \times 10^4$ times less than the density of solid tin.

Another advantage of using an under-dense plasma 103 is that the resultant EUV radiation is substantially isotropic. As noted above, this allows for a substantial portion of the total EUV radiation to be captured by NIC mirror 42 and GIC mirror 44.

2. Sn Vapor Generator

The boiling point of Sn is 2875 K, so that the walls of chamber 110 and sonic nozzle 120 need to be maintained at this temperature or higher using heat source 130 to ensure that the Sn vapor 114V formed in chamber interior 112 does not condense within the chamber interior or within sonic nozzle 120. As shown in FIGS. 3 and 4, heat source 130 can include heating coils arranged adjacent the perimeter of crucible 110 as well as adjacent the roof 113.

The boiling of Sn liquid 114L is performed to generate sufficient Sn vapor pressure within chamber interior 110 so that the Sn vapor 114V escapes from sonic nozzle 120 with the required atomic density of less than $1 \times 10^{19}$ atoms/cm$^3$. The Sn vapor column 102 travels at near sonic speed and so can be considered a jet or high-velocity stream of Sn atoms. The "boiler" configuration of the Sn vapor generator 110 provides for stable flow of Sn vapor 114V through sonic nozzle 120, thereby defining a stable Sn vapor column 102.

In an example, Sn vapor column 102 has a height of about 10 cm before it starts to spread, e.g. to form plume 105. In an example based on calculations, Sn vapor column 102 expands to twice its starting diameter $d_C$ in about 30 cm. Thus, the "plume" 105 as this term is used herein also refers to the spreading of the Sn vapor column 102 to two or more times its initial diameter $d_C$.

An example diameter of Sn vapor column has a diameter $d_C$=2 mm, though other sizes are possible (e.g., 1 mm to 3 mm) consistent with the desired size of plasma 130. The Sn condenser 180 can be maintained at a temperature above the Sn melting point of 505 K but below the Sn vapor point of 2875 K so that the Sn vapor 114V will condense to liquid 114L and stay a liquid so it can flow.

The stable and continuous flow of Sn vapor 114V through sonic nozzle 120 that forms continuous Sn vapor column 102 has the advantage that it is easy to hit the Sn vapor column with the pulses 23 from one or more laser beams 22. An estimate on the targeting position tolerance of the Sn vapor column 102 with the one or more laser beams 22 is about 0.1 mm, which is readily achievable. There is no need for the type of pulse synchronization required to hit Sn pellets that fall under the action of gravity. The speed of Sn vapor 114V within Sn vapor column 102 also allows for a relatively high repetition rate for the laser pulses 23 in laser beam 22, as discussed below.

The generation of the Sn vapor column 102 can be analyzed by modeling the Sn vapor 114V as an ideal gas for which the pressure p and the Sn-atom density n are related via the equation:

$$p = n \cdot k_B \cdot T_b \qquad \text{Eq. 1}$$

where $k_B$ is Boltzmann's constant ($1.38 \times 10^{-23}$ m²-kg/s²-°K) and $T_b$ is the boiling temperature for Sn. For a Sn-atom density n=$7.5 \times 10^{17}$ atoms/cm³, the pressure p is only 0.3 bar.

Since the pressure outside of chamber 110 is very low (i.e., the vacuum of the source region), the flow of Sn vapor 114V through the sonic nozzle 120 will choke and the flow velocity of the Sn vapor will be pinned at the speed of sound. For the modeled ideal monotonic Sn vapor (gas), the speed of sound $v_s$ is given by:

$$v_s = [(1.67)k_B \cdot T/m]^{1/2} = 575 \text{ m/s} \qquad \text{Eq. 2}$$

where m is the mass of a Sn atom (m=$2 \times 10^{-25}$ kg).

There are two other important practical considerations regarding the interaction of the laser beam(s) 22 and the Sn vapor column 102. Since plasma 103 produces some high-energy ions (i.e., debris 107), the interaction region of laser beams 22 and plasma 103 is preferably relatively sufficiently far removed (e.g., 5 cm to 10 cm) from the output end 122 of sonic nozzle 120 to avoid sonic nozzle erosion.

Also, the formation of plasma 102 by irradiation with laser pulses 23 in laser beam(s) 22 momentarily produces a gap in Sn vapor column 102 that must be replenished by the time the next one or more laser pulses arrive. If the laser pulses 23 are separated by 10 μs (100 kHz), then the section of the Sn vapor column 102 that can be replenished at a flow velocity of $v_s$ defined by equation (2) above is 5.75 mm. This means that as long as the size of the gap formed in Sn vapor column 102 by the LPP process is less than about 6 mm, the flow velocity of the Sn vapor in the Sn vapor column is adequate to fill the gap in the Sn vapor column between laser pulses.

To avoid erosion of sonic nozzle 120 and to generally ensure accessibility of the Sn vapor column 102 to one or more laser beams 22, it is preferred that the Sn vapor column persist for a distance of at least several centimeters without expanding significantly. The radial expansion of the Sn vapor column 102 can be modeled as a diffusion process whereby the change Δr in the column radius r as a function of time t is given by $$\Delta r = [2 \cdot D \cdot t]^{1/2} \qquad \text{Eq. 3}$$

where D is a diffusion coefficient, which is given by $$D = (1/3) \cdot \lambda \cdot v_a \qquad \text{Eq. 4}$$

where λ is the mean free path of the Sn atoms and $v_a$ is the average velocity of the Sn atoms. The mean free path λ can be expressed as $$\lambda = 1/[(2)^{1/2} \pi \cdot n \cdot d^2] \qquad \text{Eq. 5}$$

where d is the atomic diameter, which is 3 angstroms for Sn.

For a Sn-atom density n=$7.5 \times 10^{17}$ atoms/cm³, the mean free path is λ=3.3 μm. The mean velocity $v_a$ for a given temperature T is given by:

$$v_a = [3 \cdot k_B \cdot T/m] = 770 \text{ m/s} \qquad \text{Eq. 6}$$

According to Eq. (4), the diffusion coefficient D=8.5 cm²/s. The time t required for the radius r of the Sn vapor column 102 to double in radius from say 1 mm to 2 mm is found by Eq. (3) to be approximately t=600 μs. At the sound velocity of $v_s$=575 m/s, the Sn vapor column 102 will flow a distance of more than 30 cm over time t=600 μs. Thus, once Sn vapor column 102 is formed, it remains well-collimated for a sufficient distance. This allows for the interaction location where one or more laser beams 22 intersects the Sn vapor column 102 to be many centimeters away from output end 122 of sonic nozzle 120 and generally be accessible to the one or more laser beams 22.

Under the operating conditions stated above, Sn vapor generator 100 can generate approximately $1 \times 10^{22}$ Sn atoms/s, or about 2 mole/s of Sn atoms. Thus, about 6 kW of heat leaves chamber interior 112 via Sn effusion through sonic nozzle 120, as well as via other radiative and conductive heat losses. Heat source 130 is therefore configured to replenish this heat.

Further, since about 2 mole/s of Sn atoms leaves chamber interior 112, Sn supply system 200 is configured to ensure that a sufficient amount of Sn liquid 114L is provided to the chamber interior. Liquid-Sn pump 190 facilitates the flow of liquid Sn within the recirculation path that includes Sn condenser 180. In an example, liquid-Sn pump 190 includes an electromagnetic liquid metal pump, such as available from CMI Novacast, Inc. of Des Plaines, Ill.

It is noted that no recirculation system is 100% effective, so that Sn supply system 200 is used to provide not only recycled Sn liquid 114L to chamber 110 but also new Sn to the chamber. In an example, Sn supply system 200 can provide more Sn liquid 114L or even solid Sn (e.g. Sn pellets).

3. Sonic Nozzle

FIG. 5, introduced and discussed above, shows one example sonic nozzle 120 that can be used with chamber 110 to form a suitable Sn vapor column 102. There are a number of other sonic nozzle designs that can be used to form a fairly well-collimated Sn vapor column 102 having a select diameter $d_C$ (e.g., 1 to 3 mm), a length of about 10 cm in diameter, and a maximum atom Sn-atom density of $1 \times 10^{19}$ atoms/cm³.

The following analysis provides an example of an acceptable sonic nozzle design. Note that a sonic nozzle 120 operating in the choked condition has a flow velocity at the orifice 122O equal to the speed of sound $v_s$. The choked condition occurs whenever the pressure differential across the sonic nozzle exceeds a critical pressure ratio, which is given by:

$$P_U/P_D > [2/(\gamma+1)]^{-q} \qquad \text{Eq. A}$$

where $q = \gamma/(\gamma-1)$, γ is the specific heat ratio, which for an ideal monatomic gas is 1.67, and $P_U$ and $P_D$ are the upstream and downstream pressures, respectively.

Assuming Sn vapor 114V behaves like an ideal monatomic gas, then the critical pressure ratio $P_U/P_D$=2.05. Because chamber interior 112 is nearly at atmospheric pressure (e.g., hundreds of Torr), and the exterior to chamber 110 is substantially at vacuum (i.e., in the mTorr range), this condition will be easily satisfied so that sonic nozzle 120 will be choked.

Next, it is assumed that the flow of Sn vapor 114V through sonic nozzle 120 is isentropic, which ignores the viscosity of the Sn gas and, in particular, the friction with interior wall 125 of the sonic nozzle. It is assumed that the Sn vapor 114V can be characterized by the parameters $T_0$, $P_0$ and $n_0$, which are stagnation values for the temperature, pressure and density, respectively, and which are related by the ideal gas law as follows:

$$P_0 = n_0 \cdot k_B \cdot T_0.$$  Eq. B

Since Sn liquid 114L is continuously boiling within chamber interior 112, the stagnation temperature $T_0$ is the boiling temperature of Sn, i.e., $T_0=2875$ K. Then the stagnation pressure $P_0$ and stagnation density $n_0$ of the Sn in chamber 100 are related by Eq. (B), above with this value of $T_0$.

For isentropic flow, it can be shown that there are simple scaling relations describing the temperature, pressure and density of the Sn vapor 114L throughout the sonic nozzle 120 with respect to the stagnation values. If the Mach number M is defined as the flow velocity v normalized to the sound speed, i.e., $M \equiv v/v_s$, then the temperature T of the Sn vapor 114V anywhere within the sonic nozzle 120 can be related to the local flow velocity v according to the relationship:

$$T/T_0 = [1 + M^2 \cdot (\gamma-1)/2]^{-1}.$$  Eq. C

Similarly the local pressure P within sonic nozzle 120 is given by:

$$T/T_0 = [1 + M^2 \cdot (\gamma-1)/2]^{-q}$$  Eq. D while the local density n is given by:

$$n/n_0 = [1 + M^2 \cdot (\gamma-1)/2]^{-q}.$$  Eq. E

The critical values for the temperature T*, pressure P* and density n* at the sonic nozzle output end 122 are found by setting M=1, which yields: $T^*/T_0=0.75$; $P^*/P0=0.49$; $n^*/n_0=0.65$.

To achieve a critical density of $n^*=7.75 \times 10^{17}$ atoms/cm³ emitted at orifice 122O at the sonic nozzle output end 122, a higher density of $n_0=1.2 \times 10^{18}$ atoms/cm³ is required in chamber interior 112. Using Eq. (B), this corresponds to a pressure of $P_0=0.48$ bar. Also the temperature T of the Sn vapor 114V is reduced to the critical value of T*=2156 K at the sonic nozzle orifice 122O. The speed of sound at this temperature is $v_s=498$ m/s.

The above values of the state parameters P, T and n are the same for any (converging) sonic nozzle shape, providing that the flow of Sn vapor 114V is isentropic and that the sonic nozzle 120 is operating in the choked condition. In reality, however, the friction from nozzle wall 125 may not be entirely negligible, particularly near the sonic nozzle orifice 122O, where the aperture is relatively small, e.g., on the order of 2 mm. The interaction of the Sn vapor 114V with the wall 125 of sonic nozzle 120 will both tend to (non-adiabatically) heat the Sn vapor 114V and do work on the Sn vapor to slow the flow velocity v down at the wall (non-isentropic).

That said, it is believed that the viscosity effects are small, and the viscous forces in the Sn vapor will tend to impose laminar flow, which would improve the collimation of the Sn vapor 114V emitted by sonic nozzle 120. Designs for sonic nozzle 120 that taper slowly (e.g., as shown in FIG. 5) so that there is a relatively long distance of the small-diameter portion of channel 126 will favor laminar flow, and this should yield superior collimation of the emitted Sn vapor column 102.

To explore the condition for laminar flow, the Reynolds number $R_E$ is estimated using the expression for a straight pipe, which is:

$$R_E = \rho \cdot v_s \cdot \delta / \eta$$  Eq. F where $\rho$ is the density of the Sn vapor (gas) 114V at the critical section 126S of channel 126 and is given by $\rho=0.235$ kg/m³, $v_s$ is the flow velocity and is given by $v_s=498$ m/s, and $\delta$ is the diameter of the critical section of channel 126 and is assumed to be $\delta=2$ mm. The parameter $\eta$ is the dynamic viscosity of the Sn vapor, which is given by:

$$\eta = \{m/(3) \cdot (2)^{1/2} \pi d^2\} [8 \cdot k_B \cdot T/\pi \cdot m]^{1/2}$$  Eq. G where m is the mass of a Sn atom ($2 \times 10^{-25}$ kg), d is the atomic diameter of a Sn atom ($3 \times 10^{-10}$ m), and T=T*, i.e., the critical temperature of 2156 K. These numbers yield a value for the viscosity of $\eta=4 \times 10^{-4}$ kg/m-s. Substituting this back into Eq. (F) yields a Reynolds number of $R_E=585$.

The threshold for turbulent flow in a pipe is $R_E=2400$. The flow of Sn vapor 114V in channel 126 near output end 122 of sonic nozzle 122 is therefore in the laminar regime. However, the linear dependence on the diameter $\delta$ in Eq. (F) suggests that the flow can be turbulent at the input end 124 of sonic nozzle 120 where the diameter $\delta$ of channel 126 is large. As noted above, it is advantageous to extend the narrow section 126S of channel 126 of the sonic nozzle 120 adjacent output end 122 to allow for a full transition from turbulent to laminar flow of Sn vapor 114V before the Sn vapor exits nozzle orifice 122O. This narrow section is shown has having a length CL in FIG. 5.

If the scale length is set by the diameter $\delta$ of nozzle orifice 122O (e.g., 2 mm by way of example), then in an example, the length of this narrow section 126S of channel 126 should be at least about 10 scale lengths, or about 20 mm. The design parameters shown in the example nozzle 120 of FIG. 5 meet these criteria, wherein the length CL is about half of the entire nozzle length LT=1.614", i.e., CL≈20 mm.

4. Laser Beam Interaction with Sn Vapor Column

Simulations of the physics of the interaction of the laser beam 22 with a portion of the Sn vapor column 102 were performed. The simulations assumed a laser wavelength of 10.6 μm and an under-dense atomic density for Sn vapor column 102 associated with forming an under-dense plasma 103. The simulations were directed to: 1) maximizing EUV radiation production, e.g., >5% conversion efficiency; 2) minimizing reflection of the IR laser beam 22 to be <1%; 3) minimizing the EUV opacity of the plasma 103, i.e., <10% re-absorption of EUV radiation 104; and maintaining a small EUV source region, e.g., <1 mm diameter, when forming plasma 103.

The simulations involved varying the following system parameters: the initial Sn-atom density n, the diameter $d_C$ of the Sn column 102, the laser pulse duration r, and the intensity I (W/cm²) of laser beam 22 incident upon a section of Sn vapor column 102. It was found that a laser intensity (I) of between $5 \times 10^9$ and $1 \times 10^{19}$ W/cm² with a pulse duration r on the order of 40 to 50 nanoseconds (ns), incident on an under-dense, long-scale-length, gaseous Sn vapor column 102, yields a high conversion efficiency, low IR reflection, small EUV source size and low EUV opacity.

The simulations assumed that Sn vapor column 102 had a Sn-atom density $n=5 \times 10^{17}$ atom/cm³ (and a corresponding electron density), a diameter $d_C=2$ mm, and a laser beam intensity $I=6 \times 10^9$ W/cm², and a pulse length r of 40 ns. These parameters were found to yield the following EUV emission performance: 1) conversion efficiency to EUV radiation 104 at a wavelength of 13.5 nm of about 5%; 2) an EUV emission region within plasma 103 having diameter of about 500 μm (0.5 mm) (i.e., most of the emission from plasma 103 was from the central portion 103' of the plasma); 3) an EUV opacity of about 10%, i.e., 90% transmission from center of emission spot to outer edge of plasma; and 4) small amount of IR reflection of laser beam 22, i.e., <1%.

This LPP source of EUV radiation is nearly ideal for maximizing the delivery of EUV to the aperture of the intermediate focus IF. The production of EUV radiation 104 is maximized because laser beam 22 is not lost to reflection, etc. The nuisance of the reflected IR is eliminated, so that there is no need to employ dispersive strategies that waste EUV radiation. The size of central plasma 103' is small, which allows one to take maximum advantage of the reflective imaging optics (i.e., the NIC and GIC mirrors). The emission of EUV radiation 104 is isotropic, allowing for collection from all sides, limited only by the solid angle of the NIC and GIC mirrors 42 and 44 used in the EUV collector system 40.

5. Maximizing EUV Collection Efficiency

To take the greatest advantage of the isotropic emission of EUV radiation 104 from plasma 103, system 10 can have the double-sided configuration shown in FIG. 6. In an example, to optimize reflection efficiency at 13.5 nm, NIC mirror 42 includes a multilayer reflective coating while GIC mirror 44 includes an Ru reflective coating. DMDs 48 serve to limit the amount of debris 107 reaching NIC mirror 42 and GIC mirror 44. A buffer gas 46 (e.g., Argon) can be used to slow some of the faster ions that constitute debris 107 so that they can be captured by the rotating vanes (see FIG. 7).

In an example embodiment, NIC mirror 42 is a spherical reflector focused on the location of EUV plasma 103 so that the EUV radiation 104 incident upon the NIC mirror travels the same trajectory from plasma 103 to the multilayer reflecting surface and back again. The use of the GIC mirror 44 serves to refocus the EUV radiation 104 from NIC mirror 42 at the intermediate focus IF. Traveling at the speed of light, the EUV radiation 104 that makes it to NIC mirror 42 returns essentially instantaneously along the identical path, suffering no additional loss by passing twice through the same DMD 48.

In an example, the respective collection solid angles of NIC mirror 42 and GIC mirror 44 are maximized, and the clear path through the DMDs 48 is also maximized. An example collection solid angle for each of NIC mirror 42 and GIC mirror 44 collection optic is 5.2 steradians (sr). An example transmission through each DMD 48 is 0.85. In addition, example reflectivities for NIC mirror 42 and GIC mirror 42 are 0.7 and 0.5 (double bounce), respectively. An example laser-to-EUV energy conversion efficiency is 5%, which yields an amount of EUV power delivered to the intermediate focus of about 1.7% of the laser power made incident upon Sn vapor column 102. Under these conditions, the delivery of 1 kW of EUV power to the intermediate focus IF requires a driver laser power for laser system 20 of about 59 kW. If the laser is delivering roughly 1 joule/pulse, the laser repetition rate needs to be on the order 60 kHz, which is a relatively low pulse repetition rate that is easy to achieve.

6. In-Situ Mirror Cleaning

In an example, Sn vapor generator 100 can be configured to perform in-situ mirror cleaning of NIC and GIC mirrors 42 and 44. This can include using hydrogen or other hydride gases that can combine with the deposited Sn forming a volatile substance that can be pumped away. This in situ cleaning need only remove the small amounts of stray Sn that make it through the DMDs 48 and other containment structures to deposit on sensitive surfaces.

7. Example DMD Configuration

Figure 7:
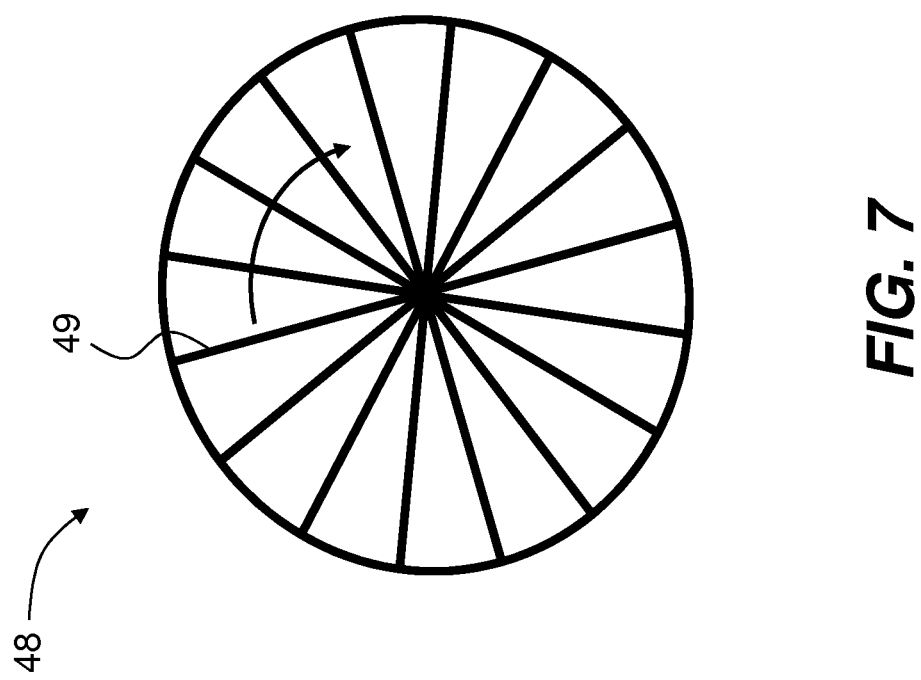
FIG. 7 is a front-on view of an example debris mitigation device showing example radial vanes that rotate to capture debris emitted from the EUV plasma.

FIG. 7 is a front-on view of an example DMD 48 that includes radially arranged rotating vanes 49. In practice, many more rotating vanes than the number shown can be used, e.g., 150 to 200 vanes. In an example DMD 48, vanes 49 are about 0.1 mm thick and are 25 cm long (deep) in the axial direction (i.e., into the page of FIG. 7). If the speed of the fastest particles making up debris 107 can be reduced to $2.5 \times 10^5$ cm/sec, then with 25 cm long vanes 49, the rotational speed of the vanes need to be about 3000 RPM to capture most of the debris.

If sticking is a problem, then as noted above additional thinner but axially longer stationary vanes 49 can be added downstream without much additional EUV absorption because of the smaller cross-sectional area. In an example, DMD 48 is configured to block no more than about 15% of EUV radiation 104 (i.e., have the aforementioned transmission of at least 0.85).

As noted above, buffer gas 46 such as Argon can be used to slow down the more energetic atoms and ions that make up debris 107. It is known that about 1 bar of Argon can be used to fully thermalize plasma expansion in about 10 mm, so 0.1 bar in about 20 mm will have about a 20% effect. While this pressure may not substantially slow the fastest ions moving at $10^7$ cm/s (or about 6 keV), it can retard the slower atoms moving at $5 \times 10^5$ cm/sec (about 15 eV) by about a factor of two or more.

In an example, the mean velocity of the Sn atoms entering the DMDs 48 was calculated to be about 366 m/s. This is sufficiently slow to make the Sn atoms easily captured by the spinning vanes 49. As an example, consider a DMD 48 rotating at $10^4$ RPM, having 5-cm-wide blades separated by 1 mm. To pass through the DMD 48 at a radius of 5 cm requires the Sn atom to have a velocity of 2600 m/s. Such a high velocity is far in the tail of the Maxwell-Boltzmann distribution, and would have a very small probability ($10^{-11}$).

Figure 8:
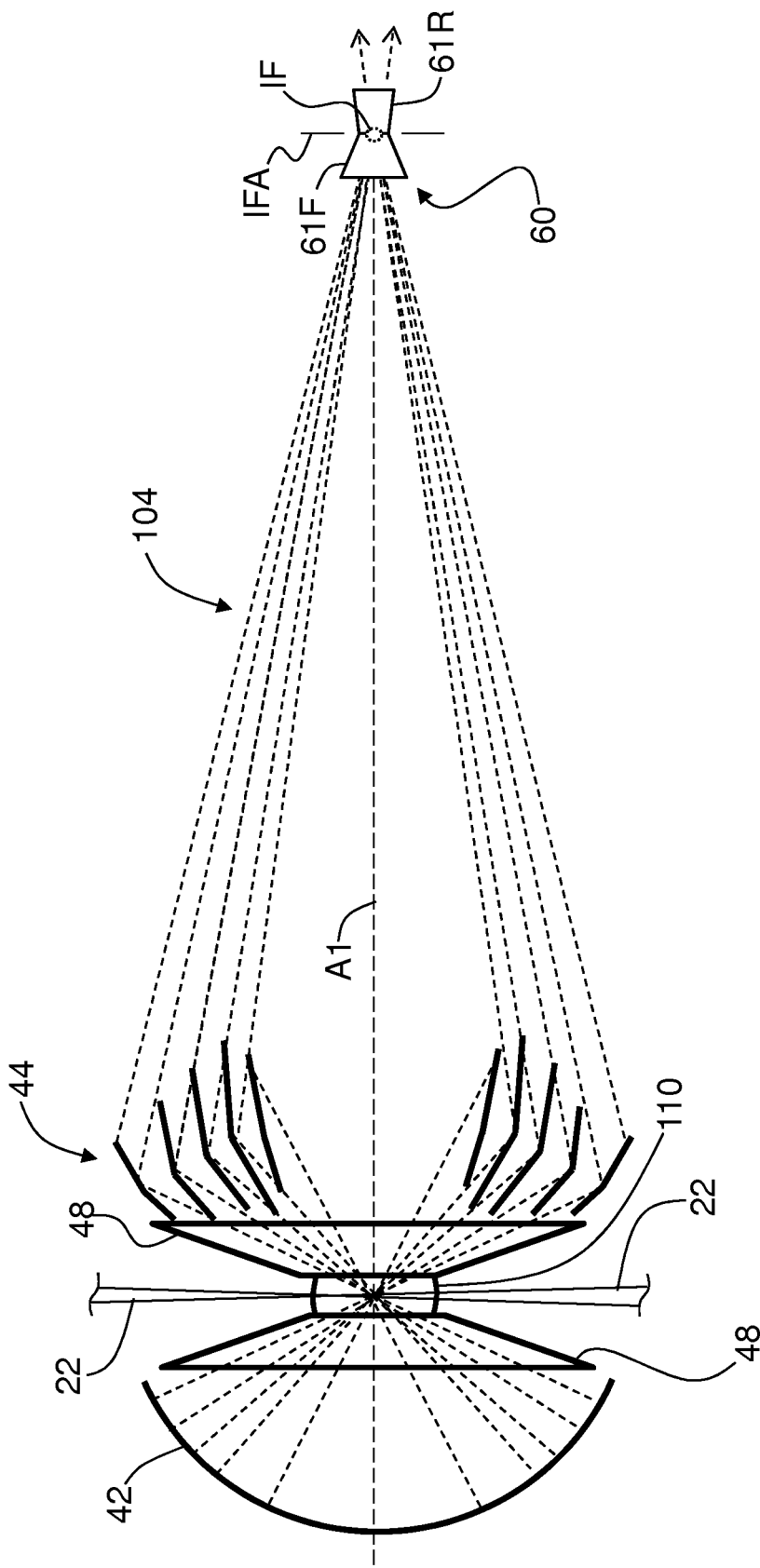
FIGS. 8 and 9 are top-down cross-sectional views of the dual-sided Sn vapor EUV LLP source system showing additional details of the configuration of the debris mitigation devices, the RCED and the NIC and GIC mirrors.
Figure 9:
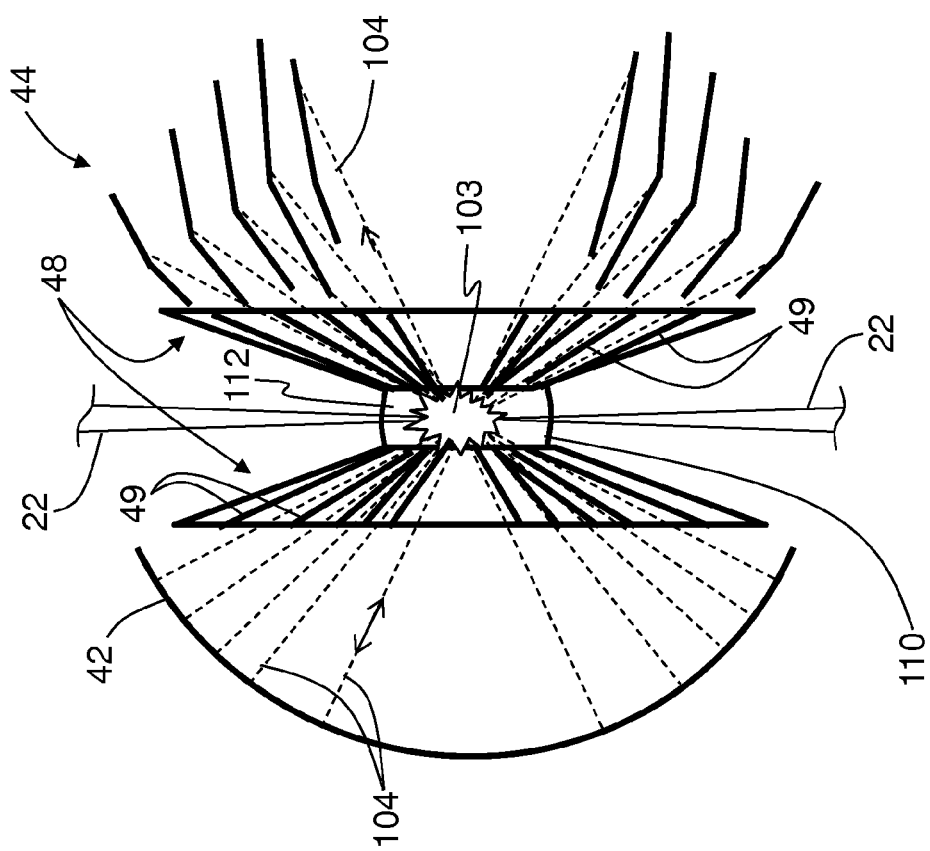

FIGS. 8 and 9 are cross-sectional views of an example system 10 showing additional details of the configuration of the debris mitigation devices and NIC and GIC mirrors. FIG. 9 is a close-up view that shows some of the blades 49, which are optimally arranged to pass the most EUV radiation 104. Note also that in the example shown, two laser beams 22 are incident upon Sn vapor column 102 from opposite directions, with each laser beam coming in perpendicular to the system axis A1. An example dual-sided RCED 60 with front and rear sections 61F and 61R is also shown at the intermediate focus aperture IFA.

In an example, DMDs 48 and chamber 110 form a snug fit or seal so that there is no leakage of Sn vapor 114V or debris 107. In this configuration, the only path for Sn vapor 114V and debris 107 to leave chamber interior 112 and get to the collector optics surfaces is through one of the DMDs 48.

8. Containment Vessel Configuration

Figure 10:
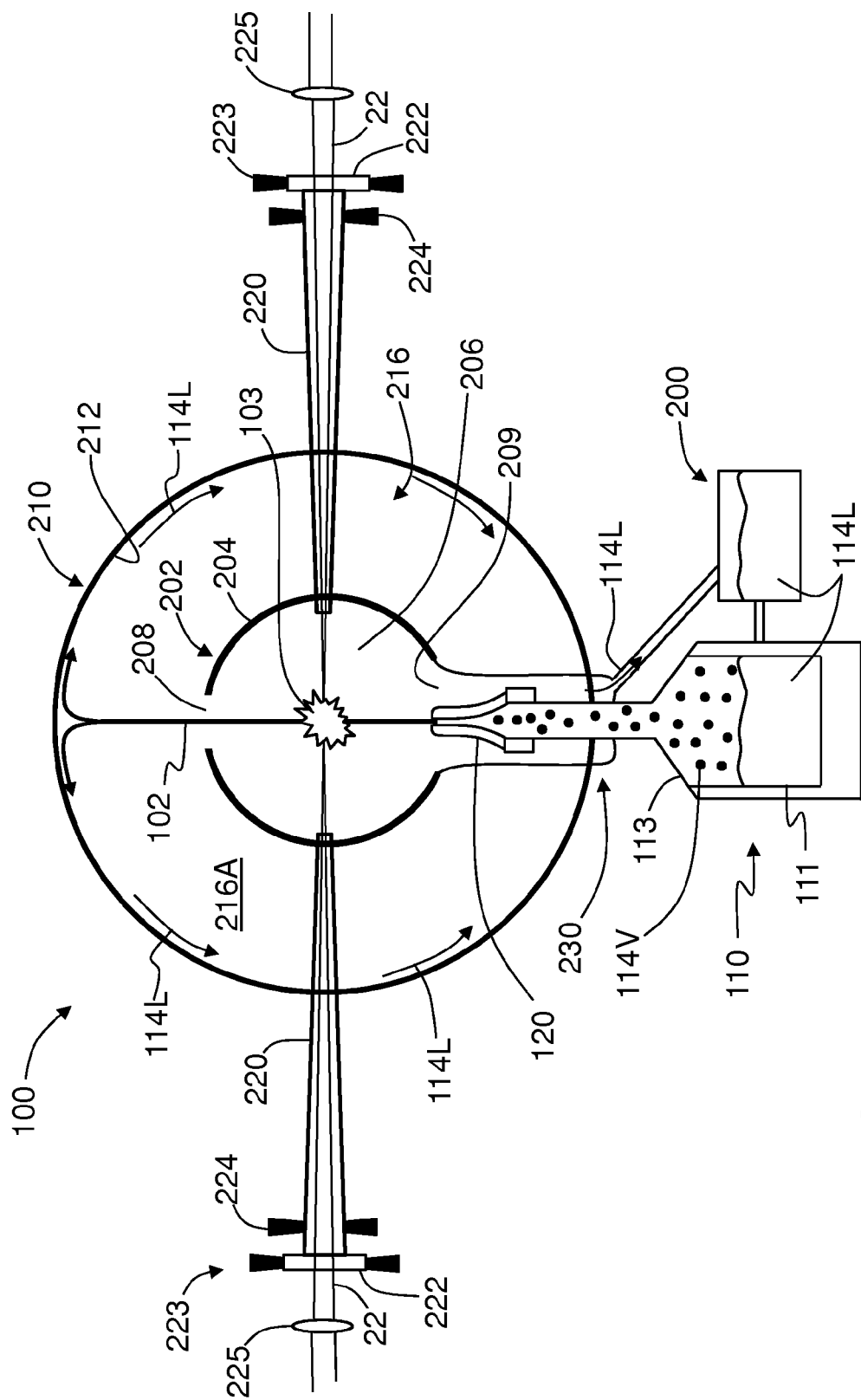
FIG. 10 is a close-up cross-sectional view looking along the NIC and GIC optical axis of an example Sn vapor generator that includes a containment vessel configuration designed to limit the diffusion of Sn vapor and related debris out of the Sn vapor generator to other parts of the Sn vapor EUV LLP source system.

FIG. 10 is a cross-sectional view of an example Sn generator 100 that is configured to provide substantial containment of Sn vapor and other debris 107. Sn generator 100 is shown as including inner and outer containment vessels 202 and 210, which by way of example are concentrically arranged spheres. In an example, outer containment vessel can have a diameter of about 25 cm.

Sn generator 100 also includes at least one laser-beam conduit 220 that is used to provide a channel for at least one laser beam 22. Two such laser-beam conduits 220 are shown that allow for two laser beams 22 to be incident upon Sn vapor column 102 from opposite directions. Inner containment vessel 202 is used to support the laser-beam conduits 220, and in an example can be replaced by other types of support structures that perform the same function. An advantage of employing inner containment vessel 202 as a support structure is that it also serves to provide an additional degree of containment of Sn vapor 114V and debris 107.

Figure 11:
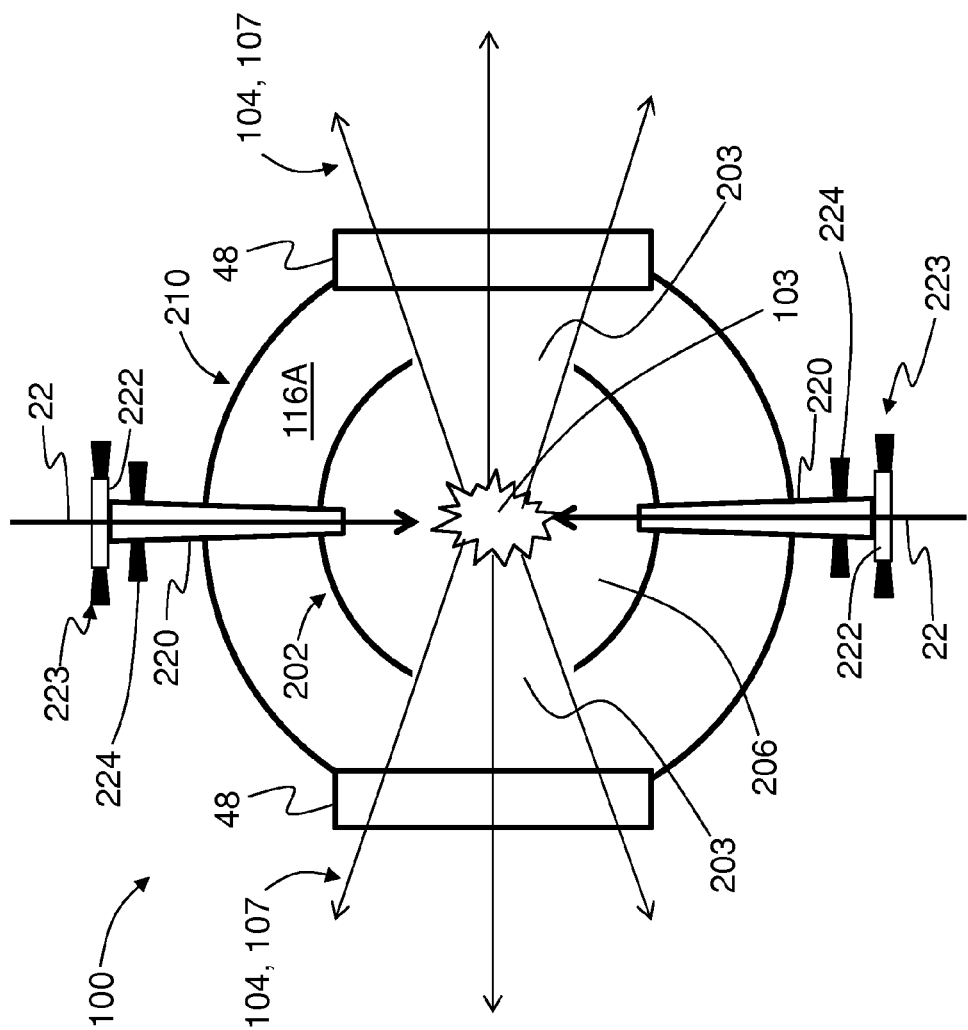
FIG. 11 is a top-down, cross-sectional view of the Sn generator of FIG. 10 that shows the debris mitigation devices operably arranged at opposite sides of the outer containment vessel and sealed thereto to prevent the escape of Sn vapor and debris other than through the DMDs.

In FIG. 10, the DMDs 48 are not visible because they are respectively on the near-side and far-side of the drawing, respectively. FIG. 11 is a top-down, cross-sectional view of Sn generator 100 that shows DMDs 48 operably arranged at opposite sides of outer containment vessel 210 and sealed thereto to prevent the escape of Sn vapor 11V and debris 107 other than a path through the DMDs. FIG. 11 also shows apertures 203 formed in opposite sides of inner containment vessel 202 that allow for EUV radiation 104 as well as debris 107 to pass out of the inner containment vessel interior 206, through the through annular interior portion 116A, and through DMDs 48 on their way to NIC mirror 42 and GIC mirror 44.

In an example embodiment, laser-beam conduits 220 include respective window systems 222 that each includes a window 223 that transmits the corresponding laser beam 22. Window systems 222 serves to prevent Sn vapor 114V and debris 107 from passing through the laser-beam conduits 220 to other parts of system 10. In an example, each window system 222 includes an isolation or interlock valve 224 that allows for removing window 23 to be cleaned or replaced without breaking vacuum. Any optical components 225 used for focusing or otherwise conditioning laser beam(s) 22 can reside external to window 223 (i.e., on the side opposite Sn generator 100) to avoid being covered in Sn or otherwise contaminated by debris 107.

Inner containment vessel 202 has an outer surface 204 and an interior 206. Outer containment vessel 210 has an inner surface 212 and an interior 216. The laser-beam conduits 220 extend through the outer containment vessel 210 and into the interior 215 of the inner containment vessel 202. The outer surface 204 of inner containment vessel 202 and the inner surface 212 of outer containment vessel 210 define an annular portion 216A of interior 216. Inner containment vessel 202 includes an upper aperture 208 that opens to annular interior portion 216A and a lower aperture 209 that leads to nozzle 120. The upper and lower apertures 208 and 209 are aligned so that Sn vapor column 102 passes through both apertures. The inner surface 212 of outer containment vessel 210 is configured to receive Sn vapor column 104 and condense the vapor to form Sn liquid 114L, which flows along the inner surface to a collection area 230, which can be located at a lower portion of the outer containment vessel 210, such as near or below nozzle 120. The collection area 230 is fluidly connected to Sn supply 200.

The containment-vessel configuration of Sn generator 100 is designed to prevent Sn vapor 114V and debris 107 from traveling over a path that does not pass through a DMD 48.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A Sn vapor EUV LLP source system for EUV lithography, comprising:
   a Sn vapor chamber adapted to generate a Sn vapor column from a supply of Sn liquid, the Sn column having a Sn-atom density of $<10^{19}$ atoms/cm$^3$;
   a Sn vapor condenser arranged to receive the Sn vapor column and condense the Sn vapor to form recycled Sn liquid;
   a Sn liquid collection system that collects and delivers the recycled Sn liquid to the supply of Sn liquid; and
   at least one laser arranged to irradiate the Sn vapor column with at least one laser beam to generate an under-dense Sn plasma having an electron density of $<10^{19}$ electrons/cm$^3$, wherein the under-dense Sn plasma substantially isotropically emits EUV radiation.

2. The system of claim 1, further comprising a grazing-incidence collector (GIC) mirror arranged to receive and direct a first portion of the emitted EUV radiation to an intermediate focus.

3. The system of claim 2, further comprising a spherical normal-incidence collector (NIC) mirror arranged to receive and direct a second portion of the EUV radiation back through the under-dense plasma and to the GIC collector, which is configured to refocus the EUV to the intermediate focus.

4. The system of claim 3, further comprising a containment vessel having an interior, and wherein the first and second DMDs are arranged at opposite sides of the containment vessel and are sealed thereto, and wherein the Sn vapor column travels from the Sn vapor generator to the Sn vapor condenser within the containment vessel interior.

5. The system of claim 4, further comprising at least one laser-beam conduit that leads into the containment vessel interior and through which the at least one laser beam travels.

6. The system of claim 5, further including a window system that includes a window and that is operably arranged relative to the least one laser-beam conduit so that the at least one laser beam travels through the window.

7. The system of claim 6, wherein the window system includes an isolation valve that seals off the laser-beam conduit from the containment vessel interior.

8. The system of claim 4, wherein the EUV radiation at the intermediate focus has a power of at least 100 W.

9. The system of claim 4, wherein the EUV radiation at the intermediate focus has a power of at least 500 W.

10. The system of claim 4, wherein the EUV radiation at the intermediate focus has a power of at least 1000 W.

11. The system of claim 3, further comprising:
    a first debris mitigation device (DMD) operably disposed between the Sn vapor column and the NIC mirror; and
    a second DMD operably disposed between the Sn vapor column and the GIC collector.

12. The system of claim 11, further comprising a radiation-enhancement collection device (RCED) arranged between the GIC mirror and the intermediate focus to further direct a portion of the EUV radiation from the GIC mirror to the intermediate focus.

13. The system of claim 12, wherein the RCED includes a rear section configured to direct at least a portion of the EUV radiation to a downstream illuminator.

14. The system of claim 1, wherein the Sn vapor column has a nominal diameter of 2 mm.

15. The system of claim 1, wherein the at least one laser consists of two or more lasers that each generate a laser beam that is made incident symmetrically upon the Sn vapor column from two or more directions.

16. The system of claim 1, wherein the Sn vapor column has a nominal diameter of between 1 mm to 3 mm.

17. The system of claim 1, further comprising a plurality of laser beams that each include laser pulses, and wherein laser pulses are made incident upon the Sn vapor column simultaneously to form the under-dense Sn plasma.

18. The system of claim 1, wherein the Sn vapor generator comprises:

a chamber having an interior that contains the Sn liquid and Sn vapor, the chamber having a sonic nozzle; and a heat source arranged to heat the Sn liquid that resides in the chamber interior to form the Sn vapor and cause the Sn vapor to escape the sonic nozzle at a sonic speed to form the Sn vapor column.

19. The system of claim 18, wherein the sonic nozzle has an input end having a first diameter of about 20 mm, an output end having a diameter of about 2 mm, and a length from the input to output ends of about 40 mm.

\* \* \* \* \*